US008669769B2

(12) United States Patent
Tsuge

(10) Patent No.: US 8,669,769 B2
(45) Date of Patent: Mar. 11, 2014

(54) METHOD AND APPARATUS FOR DETECTING DETERIORATION OF LIGHTNING ARRESTER

(75) Inventor: Kenji Tsuge, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 718 days.

(21) Appl. No.: 12/877,281

(22) Filed: Sep. 8, 2010

(65) Prior Publication Data

US 2011/0057667 A1    Mar. 10, 2011

(30) Foreign Application Priority Data

Sep. 10, 2009 (JP) ................................. 2009-209070

(51) Int. Cl.
*H01H 31/12* (2006.01)
*G01R 31/02* (2006.01)
(52) U.S. Cl.
CPC ..................................... *G01R 31/025* (2013.01)
USPC ........................................................ 324/551
(58) Field of Classification Search
None
See application file for complete search history.

(56) References Cited

U.S. PATENT DOCUMENTS

| 4,259,666 A | * | 3/1981 | Takahashi et al. | ............. 340/647 |
| 4,577,148 A | * | 3/1986 | Sweetana | ........................ 324/72 |
| 4,866,393 A | * | 9/1989 | Iwai et al. | ...................... 324/549 |
| 5,621,309 A | * | 4/1997 | Feldman | .......................... 324/72 |
| 5,663,863 A | * | 9/1997 | Ohashi et al. | .................. 361/118 |
| 6,002,571 A | * | 12/1999 | Joulie et al. | .................... 361/117 |

FOREIGN PATENT DOCUMENTS

| JP | 2942030 B2 | 6/1999 |
| JP | 2943465 B2 | 6/1999 |
| JP | 2012007903 A | * 1/2012 |

\* cited by examiner

*Primary Examiner* — Paresh Patel
(74) *Attorney, Agent, or Firm* — Burr & Brown, PLLC

(57) ABSTRACT

An apparatus for detecting deterioration of a lightning arrester includes: a high-frequency power supply; a pair of detecting terminals 12 connected to the high-frequency power supply via a resistance for measurement and touched to the terminals of the arrester; a voltage detecting circuit for obtaining a terminal voltage of the resistance for measurement when the detecting terminals touch the terminals of the arrester; and a determining circuit for comparing the detected voltage with a reference value to determine whether the detected voltage is good or bad. A voltage having a frequency sufficiently higher than the operation frequency of a power line is generated by the high-frequency power supply and applied to the arrester, and change in electrical characteristics due to deterioration of zinc oxide elements is detected as change in current including capacitive current, and then it is determined whether the detected change is good or bad.

7 Claims, 2 Drawing Sheets

METHOD AND APPARATUS FOR DETECTING DETERIORATION OF LIGHTNING ARRESTER

BACKGROUND OF THE INVENTION

1. Field of the Invention

The present invention relates to a method and an apparatus for detecting deterioration of a lightning arrester, which can accurately and simply detect the condition of deterioration of a zinc oxide type lightning arrester installed to an insulator assembly.

2. Description of the Related Art

In order to protect an insulator assembly insulatively supporting a power line such as power transmission line from a lightning strike and to prevent a power transmission line or the like from melting down due to follow current in the event of the lightning strike, a zinc oxide type lightning arrester is installed to the insulator assembly. As well known, the zinc oxide type lightning arrester is made by connecting in series a plurality of zinc oxide elements (non-linear resistor elements) having a non-linear voltage-current characteristic, putting the zinc oxide elements into a container made of an insulating material, and further insulatively covering them with a rubber, polymeric materials or the like.

Such a zinc oxide type lightning arrester is typically installed to the tower side of the insulator assembly, and a discharging electrode at the tip of the arrester is disposed opposite to a discharging electrode of the line side with the series air gap G therebetween. The zinc oxide type lightning arrester is normally separated from the power line by the series air gap G and normally is not directly applied with an operating voltage.

On the other hand, when applied with a high lightning surge voltage by the lightning strike, the zinc oxide type lightning arrester becomes conductive because of decreasing resistance of the zinc oxide elements, which causes a discharge across the series air gap to allow the lightning surge current to flow into the tower side, allowing the insulator assembly to be protected.

Since the zinc oxide type lightning arrester is installed to the insulator assembly, the arrester being normally separated from the power line with the series air gap, deterioration of the zinc oxide elements and/or polymeric housing due to continuous energizing with power frequency voltage will not occur, but a main cause of the deterioration would be partial damage of the zinc oxide elements due to excessive lightning surge operating duty. Therefore, the deterioration of the arrester cannot be detected by visual inspection.

As described in Japanese Patent No. 2,942,030, a deterioration detector for a lightning arrester has been developed that touches the terminals of the arrester with a pair of detecting terminals and measures the insulation resistance of the arrester to evaluate the deterioration condition of the arrester. However, this method may also detect the reduction in surface resistance on housing due to wetness and/or pollution of the housing surface of the arrester, and may not be able to discriminate the deterioration of the arrester itself from others, so this method has not been used in practice.

Further, as described in Japanese Patent No. 2,943,465, an apparatus for monitoring a lightning arrester for failure has been suggested, which includes a voltage generator connected in parallel to the arrester, an impedance to ground connected in parallel to the voltage generator and a capacitor connected in series to the impedance to ground, and monitors the arrester for failure by detecting current flowing in the arrester using CT, the current being caused by the voltage applied by the voltage generator.

However, this apparatus always needs to be in conjunction with the arrester to monitor the arrester for failure, and a current sensor such as CT needs to be included in the arrester. In order to implement this method, every lightning arrester needs to include equipment, such as a current sensor, which is not required for the function of the arrester itself, so this method also has not been used in practice for reasons of reliability and cost.

SUMMARY OF THE INVENTION

Accordingly, it is the object of the present invention to provide a method and an apparatus for detecting deterioration of a lightning arrester that solves the above-described problem of the conventional art, which can accurately detect the condition of deterioration of a zinc oxide type lightning arrester installed to an insulator assembly, whether in an active inactive line state, and is advantageous to workability and cost.

In order to solve the above-described problem, the invention provides a method for detecting deterioration of a zinc oxide type lightning arrester, including the steps of: applying a voltage having a frequency sufficiently higher than an operation frequency of a power line to the zinc oxide type lightning arrester installed to an insulator assembly, the arrester being normally separated from the power line with the series air gap; detecting change in electrical characteristics, including capacitance, due to deterioration of internal zinc oxide elements as change in current, including capacitive current, flowing in the arrester; and determining whether the detected change is good or bad. The frequency of the voltage applied to the arrester is preferably 100 or more times higher than the operation frequency.

Also, in order to solve the above-described problem, the invention provides an apparatus for detecting deterioration of a zinc oxide type lightning arrester installed to an insulator assembly, the arrester being normally separated, from a power line with the series air gap, including: a high-frequency power supply; a pair of detecting terminals connected to the high-frequency power supply via a resistance for measurement and touched to the terminals of the arrester; a voltage detecting section for obtaining information such as peak value, average value and waveform of the terminal voltage of the resistance for measurement when the detecting terminals touch the terminals of the arrester; and a determining section for comparing the detected voltage with a reference value previously stored or set for a normal product to determine whether the detected voltage is good or bad.

In order to downsize the detecting apparatus, the high-frequency power supply preferably includes a battery, an oscillating circuit and a high-frequency transformer. Also, in order to provide safety in maintenance work and sufficient S/N ratio to detect the signal at the same time, the voltage of the high-frequency power supply is preferably set so as to be sufficiently lower, one tenth or less, than the reference voltage of the arrester or a varistor voltage at 1 mA, so the high-frequency power supply can supply current ranging from 0.1 to 10 mA. Also, in order to protect the detecting apparatus, including the high-frequency power supply, from surge, a surge absorber is preferably provided between a pair of contact terminals. Further, a voltage detecting circuit preferably includes a band-pass filter so the signal component can be detected by using only the current from the high-frequency power supply.

According to the invention, a voltage having a frequency sufficiently higher than the operation frequency of the power line is applied to the zinc oxide type lightning arrester, and change in capacitance and resistance due to deterioration of zinc oxide elements is detected as change in current, including capacitive current, flowing in the arrester, then it is determined whether the detected change is good or bad. Specifically, by setting the frequency of the voltage applied to the arrester to a frequency 100 or more times higher than the operation frequency, the impedance of the zinc oxide elements due to capacitance can be decreased.

Accordingly, if the effect of surface resistance on housing surface due to wetness and/or pollution is negligible, the condition of deterioration of the zinc oxide elements can be accurately detected. Also, load current sufficient for detection (several mA) can be provided with a relatively low power supply voltage of approximately 100 to 1000 volts, which allows the entire apparatus to be downsized. Also, when the current flowing in the arrester is in the power supply voltage range, capacitive current is predominant, and resistive current is, in effect, negligible. Further, the capacitive current is detected at a frequency sufficiently higher than the operation frequency, so induced current and/or induced voltage noise of the power frequency from the power line can be easily removed, which provides reliable detection even in an active line state.

As described above, according to the invention, the deterioration detecting apparatus can be downsized, and the arrester itself does not include equipment, such as a current sensor, which is not required for the function of the arrester, unlike Japanese Patent No. 2,943,465.

DETAILED DESCRIPTION OF THE INVENTION

The preferred embodiment of the invention is described below. First, how a lightning arrester is installed to an insulator assembly is described with reference to FIG. 1.

Figure 1:
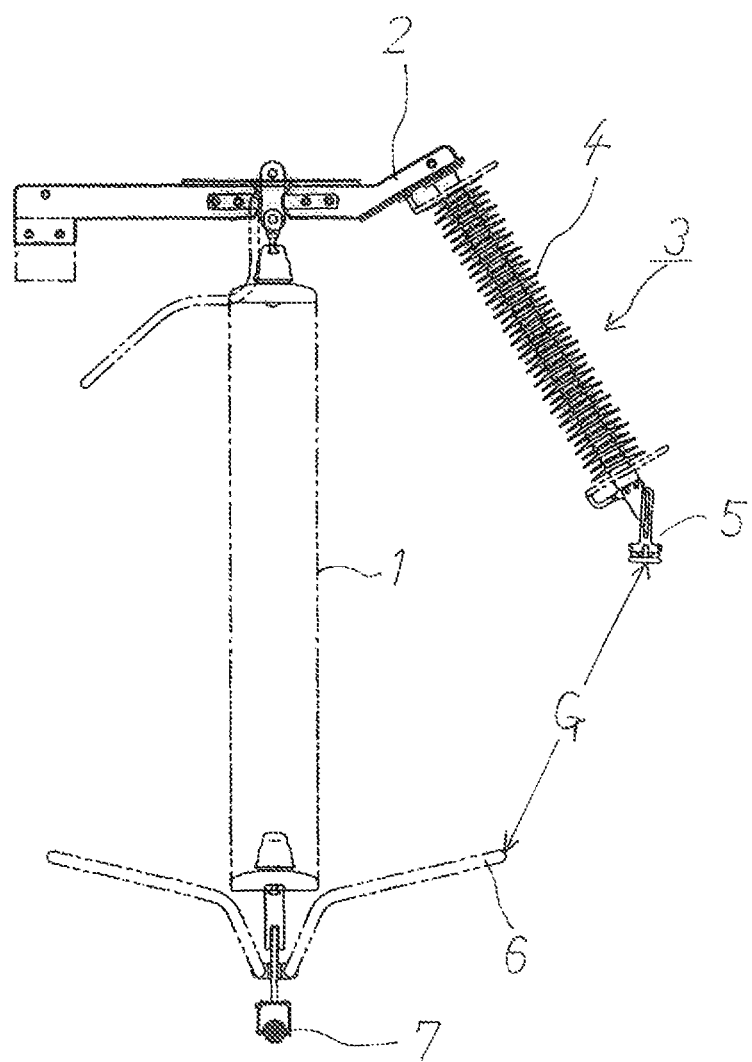
FIG. 1 shows an example of a lightning arrester.

Referring to FIG. 1, a zinc oxide type lightning arrester 3 is installed to a tower side attaching hardware 2 of suspension insulator strings 1. As described above, the arrester 3 is made by connecting in series a plurality of zinc oxide elements (non-linear resistor elements) having a nonlinear voltage-current characteristic, and insulatively putting the outer circumference of zinc oxide elements into a container 4 made of a polymeric material. A discharging electrode 5 is provided at the tip of the arrester 3. A predetermined series air gap G is formed between the discharging electrode 5 and a discharging electrode 6 on the line side of the suspension insulator strings 1. The arrester 3 is installed to the insulator assembly, the arrester being electrically separated from the power line by the series air gap G.

Figure 2:
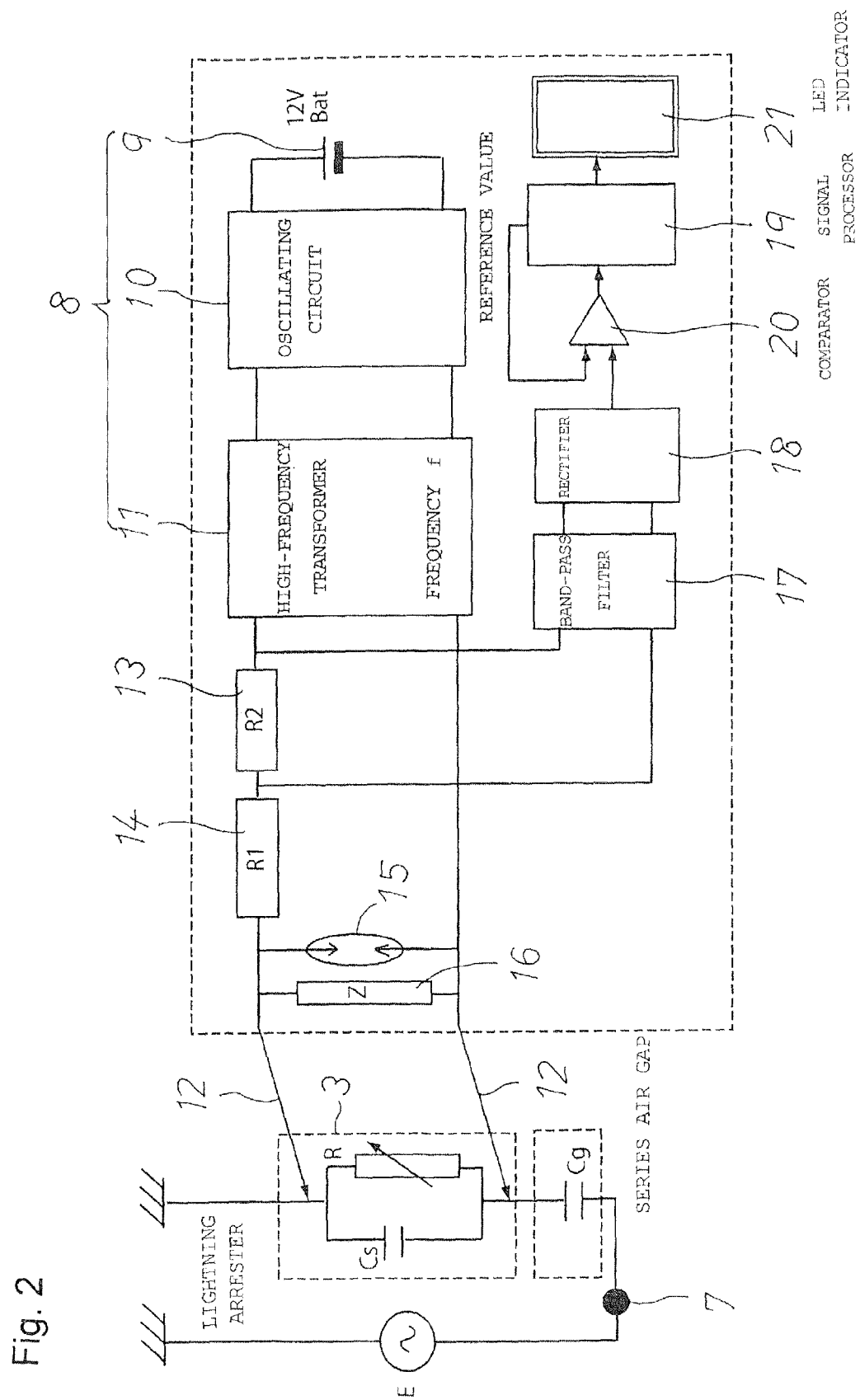
FIG. 2 is a schematic circuit diagram showing an embodiment of the invention.

FIG. 2 is a schematic circuit diagram showing an embodiment of a deterioration detecting apparatus used for detecting deterioration of the arrester 3. In FIG. 2, the arrester 3 is represented by an equivalent resistance R and an equivalent capacitance Cs of the lightning arrester 3. The equivalent resistance R is typically 1000 MΩ or more, and the equivalent capacitance Cs ranges from 10 to 100 pF. Note that a normal line-to-ground voltage E is shown. Also a power line 7 is shown.

The deterioration detecting apparatus in accordance with the invention includes a high-frequency power supply 8. The high-frequency power supply 8 includes a battery 9, an oscillating circuit 10 and a high-frequency transformer 11. In this embodiment, the battery 9 is, but not limited to, a small 12V battery. The oscillating circuit 10 generates a high frequency signal. The high-frequency transformer 11 boosts the generated high frequency signal. The boosted voltage is set from tens of volts to several kilovolts, sufficiently lower than the reference voltage of the arrester 3 of tens of kilovolts, or set so as to be sufficiently lower, one tenth or less, than the reference voltage of the arrester, or a varistor voltage at 1 mA so that the measurement can be performed in the range in which the arrester 3 can be considered a high resistance body. The frequency is set to be sufficiently higher than the operation frequency of the power line. Since the operation frequency of the power line is 50 Hz or 60 Hz, the high-frequency power supply 8 is set to generate the signal at a frequency of 100 or more times higher than the operation frequency, for example, at a high frequency of five kilohertz to hundreds of kilohertz.

A pair of detecting terminals 12 touches the tower side terminal and the discharging electrode 5 at the tip of the arrester 3. The high-frequency power supply 8 is connected to the detecting terminals 12 via a resistance for measurement 13. In this embodiment, a protection resistance 14, shown as R1, is connected in series to the resistance for measurement 13, shown as R2. In the voltage range of several hundred volts generated by the high-frequency power supply 8, the arrester 3 can be considered an insulating body having a resistance of 1000 MΩ or more, the impedance of the zinc oxide elements can be represented by the capacitance component ($1/(2\pi fCs)$), where f is the frequency, and Cs is the equivalent capacitance of the zinc oxide elements. Note that the protection resistance 14 prevents excessive current from flowing in the detecting circuit when a short circuit accidentally occurs between the detecting terminals 12, and is set to a value similar to or a little lower than the impedance of the zinc oxide elements($1/(2\pi fCs)$).

When the detecting terminals 12 touch their respective ends of the arrester 3 as shown in FIG. 2, current, including capacitive current, depending on the impedance, flows, and the amount of current is detected from the terminal voltage of the resistance for measurement 13. In accordance with the invention, the high-frequency power supply 8 can supply current ranging from 0.1 to 10 mA, which provides safety in maintenance work and sufficient SN ratio detect the signal at the same time.

Bypass impedance 16 suppresses voltage induced between the terminals of the arrester 3 due to system voltage when the measurement is performed in an active line state. When the measurement is performed in an inactive line state, the bypass impedance 16 is unnecessary and may be removed or turned off by a switch provided in series.

From the terminal voltage of the resistance for measurement 13, a band-pass filter 17, a voltage detecting section, filters out the induced voltage due to the system voltage and extracts only the frequency component of the high-frequency power supply 8. The extracted voltage is converted to DC signal voltage by a rectifying circuit 18. Note that the center frequency of the band-pass filter 17 is set to the oscillating frequency of the high-frequency power supply 8. The DC signal voltage is compared with a reference value input from a signal processor 19, the reference value being previously stored or set for a normal product. If the zinc oxide elements have deteriorated and the capacitance has become larger than that in healthy state, the impedance ($1/(2\pi fCs)$) decreases, causing the current including the capacitive current, to increase. As a result, the DC signal voltage becomes higher, and the comparator 20, acting as a determining circuit, determines that deterioration has occurred. This determination result can be indicated to an operator by an indicator 21, such as an LED. If the deterioration detecting apparatus captures waveform data for the determination, the rectifying circuit can be bypassed, and a captured waveform is compared with a reference waveform previously stored in a memory or set for a normal product, then determination and indication are performed, as with the above.

As described above, in accordance with the invention, deterioration detection is performed by applying voltage with a frequency (e.g., 30 kHz) sufficiently higher than the frequency of the operation voltage of the arrester (50 Hz/60 Hz), which allows sufficient load current (several mA) to be provided to the zinc oxide elements having a capacitance ranging from 10 to 100 pF even with a relatively low voltage of several hundred volts. Accordingly, the required output power of the high-frequency power supply 8 may be only several watts. As a result, the high-frequency power supply 8 may be a compact power supply that can be driven by a compact, general-purpose battery. Thus, the deterioration detecting apparatus can be compact in size, driven by a stand-alone power supply, and attached to the tip of a live-line tool to be conveniently used in maintenance work, particularly on a tower.

Also, when performing the deterioration detection under the above condition, the impedance of the zinc oxide elements are considered to be several hundreds of kΩ, which is sufficiently smaller than the reduction in surface resistance on housing due to pollution and/or wetness of the polymeric housing 4 of the arrester 3 (typically tens to hundreds of MΩ), so the effect of pollution and/or wetness is negligible, and deterioration detection can be accurately performed.

Note that deterioration detection in accordance with the invention can be accurately performed, whether in an active or inactive line state.

What is claimed is:

1. A method for detecting deterioration of a zinc oxide type lightning arrester being normally separated from the power line with the series air gap, comprising the steps of: applying a voltage having a frequency sufficiently higher than an operation frequency of a power line, to the zinc oxide type lightning arrester installed to an insulator assembly, detecting change in electrical characteristics including capacitance due to deterioration of internal zinc oxide elements as change in current including capacitive current flowing in the arrester; and determining whether the detected change is good or bad.

2. The method for detecting deterioration of a lightning arrester according to claim 1, wherein the frequency of the voltage applied to the arrester is 100 or more times higher than the operation frequency.

3. An apparatus for detecting deterioration of a zinc oxide type lightning arrester installed to an insulator assembly, the arrester being normally separated from a power line with the series air gap, comprising: a high-frequency power supply; a pair of detecting terminals connected to the high-frequency power supply via a resistance for measurement and touched to the terminals of the arrester; a voltage detecting section for obtaining information such as peak value, average value and waveform of the terminal voltage of the resistance for measurement when the detecting terminals touch the terminals of the arrester; and a determining section for comparing the detected voltage with a reference value previously stored or set for a normal product to determine whether the detected voltage is good or bad.

4. The apparatus for detecting deterioration of a lightning arrester according to claim 3, wherein the high-frequency power supply comprises a battery, an oscillating circuit and a high-frequency transformer.

5. The apparatus for detecting deterioration of a lightning arrester according to claim 3, wherein the voltage of the high-frequency power supply is set so as to be sufficiently lower, one tenth or less, than the reference voltage of the arrester or a varistor voltage at 1 mA and so that the high-frequency power supply can supply high frequency current ranging from 0.1 to 10 mA.

6. The apparatus for detecting deterioration of a lightning arrester according to claim 3, wherein a surge absorber is provided between a pair of contact terminals.

7. The apparatus for detecting deterioration of a lightning arrester according to claim 3, wherein the voltage detecting section comprises a band-pass filter with its center frequency set to the oscillating frequency of the high-frequency power supply.

* * * * *